(12) United States Patent
Chandra

(10) Patent No.: US 8,736,036 B2
(45) Date of Patent: May 27, 2014

(54) LAMINATING ENCAPSULANT FILM CONTAINING PHOSPHOR OVER LEDS

(75) Inventor: Haryanto Chandra, Mountain House, CA (US)

(73) Assignee: Philips Lumileds Lighting Company LLC, San Jose, CA (US)

( * ) Notice: Subject to any disclaimer, the term of this patent is extended or adjusted under 35 U.S.C. 154(b) by 949 days.

(21) Appl. No.: 12/050,132

(22) Filed: Mar. 17, 2008

(65) Prior Publication Data

US 2008/0157103 A1 Jul. 3, 2008

Related U.S. Application Data

(62) Division of application No. 11/261,122, filed on Oct. 28, 2005, now Pat. No. 7,344,952.

(51) Int. Cl.
*H01L 23/495* (2006.01)

(52) U.S. Cl.
USPC ............... 257/676; 438/25; 438/26; 438/106; 257/E21.54; 257/E21.85; 257/E33.061

(58) Field of Classification Search
USPC ............... 257/676, E21.54, E21.84, E33.061; 438/25–26, 106
See application file for complete search history.

(56) References Cited

U.S. PATENT DOCUMENTS

| 6,521,915 | B2 | 2/2003 | Odaki et al. |
| 6,686,676 | B2 * | 2/2004 | McNulty et al. ............ 313/112 |
| 7,009,343 | B2 | 3/2006 | Lim et al. |
| 7,087,463 | B2 * | 8/2006 | Sackrison et al. ............ 438/113 |
| 7,157,745 | B2 * | 1/2007 | Blonder et al. ............ 257/98 |
| 7,207,691 | B2 * | 4/2007 | Lee et al. ............ 362/231 |
| 7,420,218 | B2 * | 9/2008 | Nagai ............ 257/98 |
| 2003/0146411 | A1 | 8/2003 | Srivastava et al. |
| 2007/0007542 | A1 * | 1/2007 | Fujiwara ............ 257/98 |
| 2007/0034890 | A1 * | 2/2007 | Daschner et al. ............ 257/100 |

FOREIGN PATENT DOCUMENTS

| EP | 0890996 A2 | 1/1999 |
| EP | 1538681 A2 | 8/2005 |
| JP | 2006303373 A | 2/2006 |
| JP | 2007116133 A | 10/2007 |

* cited by examiner

*Primary Examiner* — Elias M Ullah

(57) ABSTRACT

A process is described for wavelength conversion of LED light using phosphors. LED dies are tested for correlated color temperature (CCT), and binned according to their color emission. The LEDs in a single bin are mounted on a single submount to form an array of LEDs. Various thin sheets of a flexible encapsulant (e.g., silicone) infused with one or more phosphors are preformed, where each sheet has different color conversion properties. An appropriate sheet is placed over an array of LED mounted on a submount, and the LEDs are energized. The resulting light is measured for CCT. If the CCT is acceptable, the phosphor sheet is permanently laminated onto the LEDs and submount. The lamination encapsulates each LED to protect the LEDs from contaminants and damage. The LEDs in the array of LEDs on the submount are separated. By selecting a different phosphor sheet for each bin of LEDs, the resulting CCT is very uniform across all bins.

8 Claims, 3 Drawing Sheets

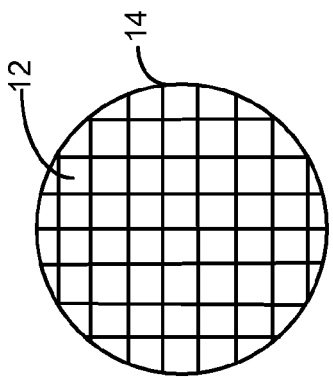
Fig. 1 (prior art)
Bin 1: 440-445 nm
Bin 2: 445-450 nm
Bin 3: 450-455 nm
Bin 4: 455-460 nm
Fig. 2
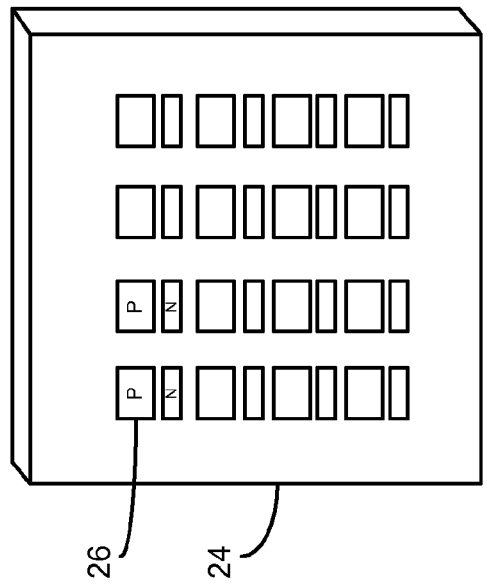
Fig. 3B (prior art)
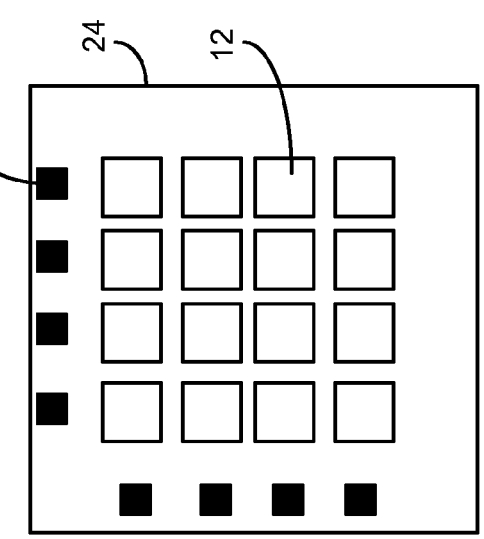
Fig. 3A (prior art)

LAMINATING ENCAPSULANT FILM CONTAINING PHOSPHOR OVER LEDS

This application is a divisional of U.S. patent application Ser. No. 11/261,122, now U.S. Pat. No. 7,344,952, filed on Oct. 28, 2005, entitled Laminating Encapsulant Film Containing Phosphor Over LEDs, incorporated herein by reference.

FIELD OF THE INVENTION

This invention relates to light emitting diodes (LEDs) and, in particular, to wavelength conversion of the light from LED chips.

BACKGROUND

Light emitting diodes (LEDs) can be fabricated to generate light in different colors. For producing white light, various colors can be combined. One way of producing white light from an LED structure is to deposit a yellow phosphor over a blue LED. There are many ways to do this. One of the most common ways is to mix phosphor particles in an encapsulation material and coat it over the LED. Another way is electrophoretic deposition where phosphor particles are deposited directly onto LEDs.

White light is produced when some of the blue light that is allowed to leak through the phosphor layer combines with the yellow light.

Another way of producing white light is to combine red, green, and blue light. This can be achieved either through the use of red, green and blue LEDs or through blue LEDs with red and green phosphors.

LEDs, such as blue and UV GaN LEDs, vary slightly in color emission even in the same wafer. Applying the same phosphor coating to all LEDs will thus result in a range of color temperatures (i.e., correlated color temperature or CCT) due to the varying characteristics of the LEDs. Further, variations in the amount of phosphor in the coating will also undesirably increase the CCT range. As a result, the output color (e.g., CCT of white light) can vary greatly, even though the fabrication process is the same.

Known or common challenges with some of the above methods include: 1) complexity of the phosphor deposition process; and 2) variations in the amount of phosphor from LED to LED, resulting in inconsistent color temperatures.

SUMMARY

A highly reliable and simple process is described for wavelength conversion of LED light using phosphors. The process results in a uniform color temperature across all LEDs despite the LEDs emitting light with varying color temperatures.

LED dies are formed on wafers, tested, separated, and binned according to their color emission. In one example, the LEDs are GaN based blue LEDs with an emission of about 450 nm, where the range of wavelengths in each bin can be, for example, 5 nm. In one example, there are four bins.

The LEDs in a single bin are mounted on a single submount to form an array of LEDs. In one example, there are around 400 LEDs mounted on a single submount. In one example, the submount is a rigid substrate that provides top contact pads for mounting each LED, where the top pads are electrically connected to bottom contact pads for connection to a printed circuit board or other structure. The submount may also contain metal traces that interconnect multiple LEDs together.

Various thin sheets (e.g., 100 microns thick) of a flexible encapsulant (e.g., silicone) infused with one or more types of phosphors are preformed. There may be one or more types of sheets associated with each bin of LEDs. Each sheet has different color conversion properties. The color conversion properties may be varied by varying the phosphor concentration in the encapsulant within a range of, for example, 20-70 weight %. The thickness of the sheet may also be varied from, for example, 50-200 microns to vary the amount of phosphor in the sheet. The sheets may also be varied by varying both the thickness and the weight ratio.

The characteristics of each sheet may be determined empirically by energizing each sheet with the light emitted by a binned LED and adjusting the sheet until the resulting light meets the desired color criteria.

After the phosphor sheets are formed, the appropriate sheet is placed over an array of LEDs mounted on a submount, and the LEDs are energized by probing LED contact pads or applying a current to any test pads on the periphery of the submount. The resulting light is then measured for CCT. If the CCT is acceptable, the phosphor sheet is permanently laminated onto the LEDs and submount such as by heat and pressure or by a combination of heat and a vacuum. If the tested CCT was not adequate, a different type of phosphor sheet would be used and tested.

The lamination encapsulates each LED to protect the LEDs from contaminants and damage.

Since there is a range of colors in a bin, there may be multiple phosphor sheets associated with each bin.

After the lamination, the LEDs in the array of LEDs on the submount are separated. The separated and encapsulated LEDs may then be mounted on PCBs.

In another embodiment, the phosphor sheets are associated with bins, and there is no further test to determine whether the particular sheet produces the desired CCT. It is assumed the CCT is correct.

Since the phosphor sheets are of a uniform thickness and the different sheets compensate for the variations in wavelength emitted by the LEDs, the resulting CCT is very uniform.

BRIEF DESCRIPTION OF THE DRAWINGS

FIG. 1 is a top down view of a wafer on which is formed LEDs.

FIG. 2 illustrates how the LED separated from the wafer are tested and binned according to their peak emission wavelength.

FIG. 3A is a front perspective view of LEDs of a single bin mounted on a submount. The submount shows optional test pads along its periphery electrically connected to the LEDs.

FIG. 3B is a back perspective view of the submount of FIG. 3A showing the back contact pads of the submount connected to the n and p metal of one or more associated LEDs.

DETAILED DESCRIPTION

Figure 5:
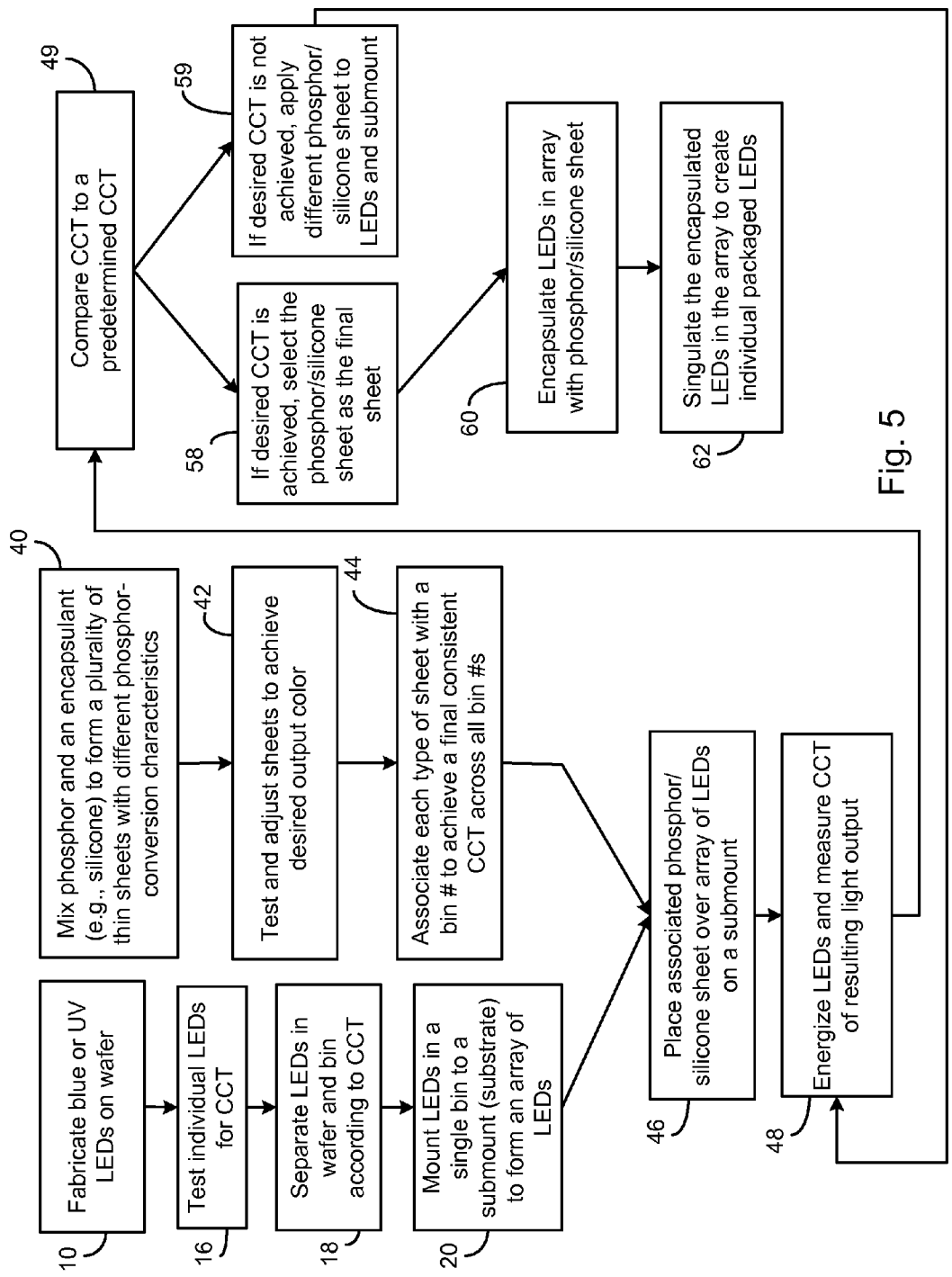
FIG. 5 is a flowchart describing one embodiment of the inventive process.

FIG. 5 is a flowchart illustrating one embodiment of a process for wavelength conversion of LED light to produce a uniform output CCT despite the LEDs emitting light with different color temperatures.

In step 10 of FIG. 5, LEDs are formed on a wafer in a conventional manner. FIG. 1 is a front view of LEDs 12 formed on a growth wafer 14. In one embodiment, the growth wafer is sapphire, GaN, or SiC, and the LEDs are GaN-based LEDs that emit a blue or UV light. In other embodiments, the LEDs and growth substrate may be any type. GaN based LEDs are particularly suitable for forming blue or UV LEDs frequently used in conjunction with a phosphor for wavelength conversion.

In step 16 of FIG. 5, the individual LEDs are probed to energize each LED. The peak wavelength of emitted light from each LED is measured by a color detector. In the present example, the LEDs' measured color falls into one of four ranges of color. Each range is referred to as a bin. In one example, as shown in FIG. 2, the LEDs emit blue light and are grouped in one of four bins 1-4 as follows: 1) 440-445 nm; 2) 445-450 nm; 3) 450-455 nm; and 4) 455-460 nm. There may be additional bins or different criteria for each bin. The bin number for each LED is temporarily stored in a memory.

In step 18, the LEDs 12 are separated such as by scribing and breaking. In one embodiment, the wafer is first placed on a stretchable adhesive sheet. After scribing, a roller bends the wafer to break along the scribe lines. The sheet is then stretched to physically separate the LEDs from each other. The LEDs are then removed from the adhesive sheet and grouped (binned) according to their preassigned bins. All the above processes may be performed automatically by programmed machines.

In step 20, the LEDs in a single bin are mounted on a submount. The submount may be a ceramic, silicon, or other material substrate with electrical interconnections formed on its surface. FIG. 3A is front perspective view of LEDs 12 mounted on submount 24. In one embodiment, there are about 400 LEDs mounted on a single submount. The LEDs 12 have n and p metal pads, and the top surface of submount 24 has corresponding metal pads. The LED pads may be directly bonded to the submount pads by any means such as solder or ultrasonic weld. Alternatively, one or more of the LED pads may be connected to the submount pads by a wire connector.

The submount pads are electrically connected, such as by metal traces and vias, to other submount contact pads for connection to a power supply. For example, the submount's top contact pads may be connected to corresponding n and p bottom contact pads 26 shown in the back perspective view of FIG. 3B. The back contact pads 26 may later be bonded to corresponding pads on a printed circuit board or other structure.

FIG. 3A additionally shows test pads 30 around the periphery of submount 24. The test pads 30 are electrically connected to the various top contact pads for energizing groups or all of the LEDs at the same time.

In a parallel process, phosphor sheets are formed. In step 40 of FIG. 5, a suitable phosphor powder is mixed with a liquid encapsulant material such as silicone, epoxy, an acrylic, or other suitable material. Phosphor powders that convert blue or UV light to white light are well known. A phosphor that converts blue light to yellow light may be used for creating white light by allowing some blue light to leak through the phosphor layer. A red phosphor may be combined with the yellow phosphor to add warmth to the white light. Alternatively, the phosphor powder may include green and red phosphors for adding red and green components to the blue component to create white light. If a UV LED is used, a blue phosphor would additionally be used in the phosphor sheet.

Thin phosphor sheets may be formed by depositing a silicone-phosphor mixture on a non-stick release layer overlying a flat surface and then spinning the material to form a thin sheet of uniform thickness. A thin sheet may also be formed by depositing a predetermined amount of the silicone-phosphor mixture in a mold, or by spraying a predetermined amount of material on a release layer.

The amount of phosphor that resides over each portion of the LED determines the percentage of LED light that is wavelength-converted by the phosphor. The amount of phosphor over each portion of the LED may be adjusted by forming phosphor sheets with different densities of phosphor (i.e., different phosphor-to-encapsulant weight ratios), or with different ratios of two or more phosphor (e.g., red and green) powders, or with different thicknesses of the sheets, or using a combination of these. In one embodiment, there is a phosphor sheet associated with each of the four bins with each sheet having a different phosphor-to-encapsulant weight ratio. The ratios will typically be in the range of 20-70%. If the thickness of the sheets are to be varied to achieve the desired wavelength conversion, the thickness may range between 50-200 microns.

In one embodiment, the phosphor sheet is partially cured by applying heat so that the sheet is flexible and somewhat tacky. The sheet is then removed from the flat surface along with the release layer.

The particular characteristics of each sheet may be determined empirically by subjecting the sheet to light of a certain wavelength and then measuring the resulting emission. If the emission does not meet the required CCT, the characteristics of the sheet are adjusted (step 42) by, for example, changing the weight ratio of the phosphor(s) and/or changing the thickness of the sheet. Once the sheet formulas for each binned LED are satisfactory, quantities of the sheets may be made.

In step 44 of FIG. 5, each type of phosphor sheet is associated with a bin number to achieve a consistent CCT of the output light across all bins.

Figure 4:
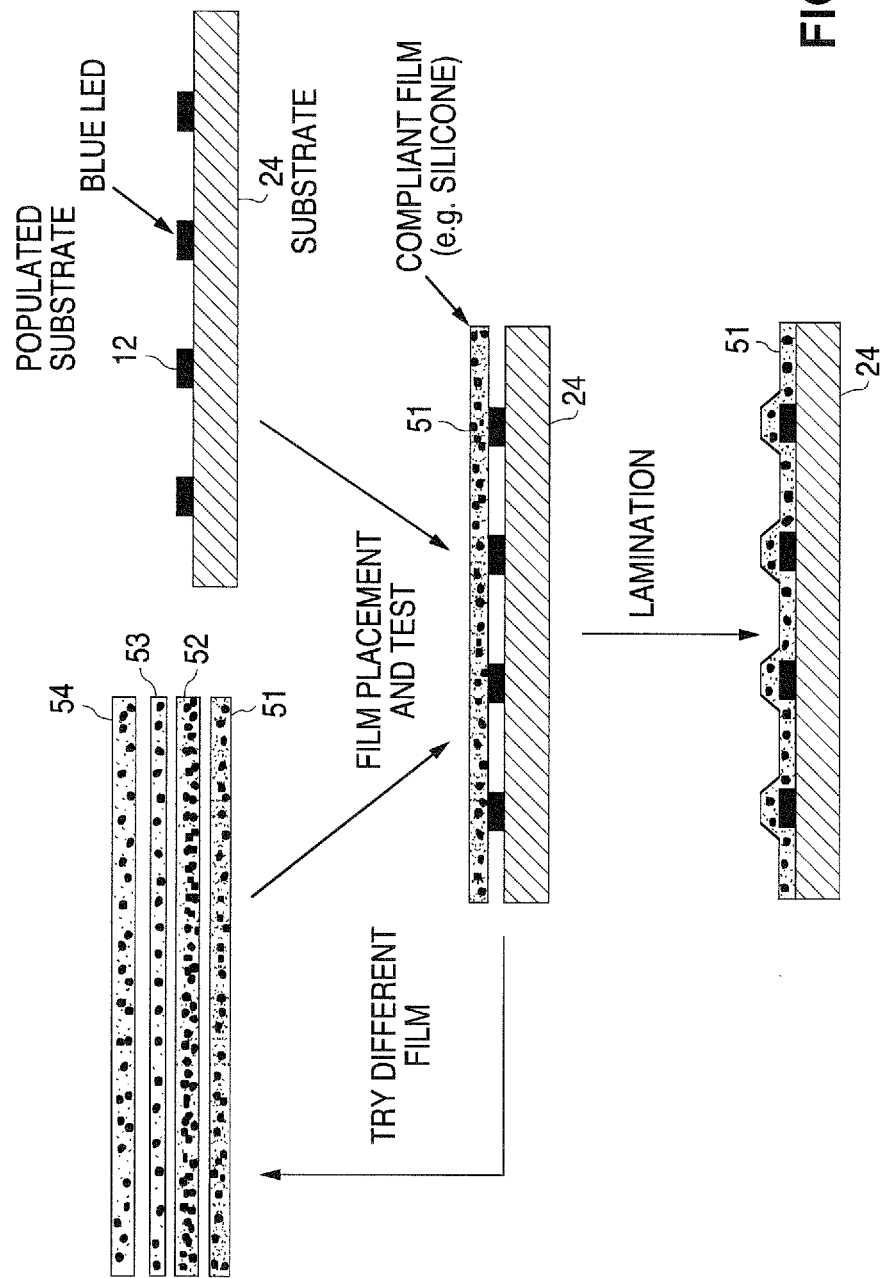
FIG. 4 illustrates various steps in one embodiment of the inventive process for laminating one of a plurality of phosphor sheets to an array of LEDs on a submount to achieve a uniform output CCT.

FIG. 4 illustrates the process for laminating a selected phosphor sheet onto the LEDs mounted on a submount. Side views of the submount 24 substrate, LEDs 12, and phosphor sheets 51, 52, 53, and 54 are shown. In one example, sheet 51 is associated with bin 1, sheet 52 is associated with bin 2, sheet 53 is associated with bin 3, and sheet 54 is associated with bin 4.

In step 46 of FIG. 5, the phosphor sheet 51 associated with bin 1 is placed over the array of LEDs 12 from bin 1 on the submount 24.

In step 48, the LEDs are then energized by probing or by using test pads on the submount. Ideally, all or large groups of LEDs are energized at the same time to save time. Alternatively, only one or a few sample LEDs may be energize to determine if the sheet 51 is suitable.

In step 49, the resulting light is measured using a color detector and compared to a predetermined CCT (e.g., a particular white point). In step 58, if the CCT meets the desired criteria, the sheet is deemed acceptable. In step 59, if the sheet 51 does not produce the desired color, a different sheet (either chosen from sheets 52-54 or additional sheets) is placed over the LED array, and testing is repeated. In one embodiment, two or three different sheets are associated with each bin, and the best fit sheet is used for the array.

In step 60, the selected sheet is laminated onto the LED array by heat and pressure. This encapsulates each LED to protect it from contaminants and provides a uniform thickness phosphor layer over the LED. In one embodiment, a soft (e.g., rubber) pad is applied to the sheet 51 under pressure while the area is heated to cure the encapsulant. Curing may also be by UV. The phosphor sheet may also be laminated by providing a vacuum between the sheet and the submount. Once cured, the encapsulant adheres to the LED and submount. The encapsulant may cure hard or may be relatively soft. Any release layer film is then removed from the top of the phosphor sheet.

In another embodiment, the phosphor sheet is formed over a thin adhesive layer, and the adhesive layer (along with the phosphor sheet) is affixed to the LEDs and submount. The adhesive is then cured. The adhesive layer may be any type of transparent layer such as epoxy.

FIG. 4 shows the phosphor sheet 51 conforming to the shape of the LEDs after encapsulation.

In step 62, after curing, the LEDs on the submount may be separated by scribing and breaking, sawing, or other technique. The singulated, encapsulated LEDs form individual packaged LEDs. The LEDs may be additionally packaged to provide lenses, terminal pins for soldering, heat sinks, and a protective structure.

In another embodiment, there is no separate testing in steps 48, 49, 58, and 59 since the sheets have already been tested when formulating the sheets for each bin. It is assumed the sheets preassociated with the bins will perform the desired wavelength conversion.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A light emitting diode (LED) structure comprising:
   a plurality of LEDs mounted on a single submount wafer, all LEDs on the submount wafer emitting a peak wavelength within a predetermined range of peak wavelengths, the submount wafer having a mounting surface; and
   a unitary preformed encapsulant sheet, of uniform thickness, laminated over the submount wafer, including over all the LEDs mounted on the submount wafer, the encapsulant sheet encapsulating all of the LEDs on the submount wafer, the encapsulating sheet having the same uniform thickness both between the LEDs and over the LEDs after encapsulating the LEDs,
   the preformed encapsulant sheet of uniform thickness being infused throughout its thickness with one or more types of phosphors for converting light emitted by each LED into light of a different wavelength.

2. The LED structure of claim 1 wherein the plurality of LEDs mounted on the submount wafer comprises an array of LEDs mounted on the submount wafer, each LED in the array emitting a peak wavelength within a predetermined range of peak wavelengths.

3. The LED structure of claim 1 wherein the encapsulant sheet is one of a plurality of encapsulant sheets having different wavelength-conversion characteristics and selected based on a peak wavelength emitted by the plurality of LEDs such that the combination of the plurality of LEDs and the encapsulant sheet produces a certain predetermined color.

4. The LED structure of claim 1 wherein the combination of the LEDs and the encapsulant sheet has been tested prior to the encapsulant sheet being permanently affixed to the LEDs.

5. The LED structure of claim 1 wherein the encapsulant sheet has a thickness between 50-200 microns.

6. The LED structure of claim 1 wherein the encapsulant sheet comprises silicone.

7. The LED structure of claim 1 wherein the plurality of LEDs are GaN based LEDs emitting blue or UV light.

8. A light emitting diode (LED) structure comprising:
   an LED mounted on a top surface of a submount; and
   a unitary preformed encapsulant sheet, of uniform thickness, laminated over and encapsulating the LED on the submount's top surface, the encapsulating sheet extending to edges of the submount, the encapsulating sheet having the same uniform thickness both over the LED and over all areas of the top surface not over the LED, the preformed encapsulant sheet of uniform thickness being infused throughout its thickness with one or more types of phosphors for converting light emitted by the LED into light of a different wavelength.

* * * * *